(12) United States Patent
Wang et al.

(10) Patent No.: US 11,424,124 B2
(45) Date of Patent: Aug. 23, 2022

(54) METHOD OF FORMING A PATTERNED HARD MASK AND METHOD OF FORMING CONDUCTIVE LINES

(71) Applicant: NANYA TECHNOLOGY CORPORATION, New Taipei (TW)

(72) Inventors: Chien-Chung Wang, New Taipei (TW); Hsih-Yang Chiu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 176 days.

(21) Appl. No.: 17/090,869

(22) Filed: Nov. 5, 2020

(65) Prior Publication Data
US 2022/0139710 A1 May 5, 2022

(51) Int. Cl.
*H01L 21/033* (2006.01)
*H01L 21/768* (2006.01)

(52) U.S. Cl.
CPC ...... *H01L 21/0338* (2013.01); *H01L 21/0335* (2013.01); *H01L 21/0337* (2013.01); *H01L 21/76816* (2013.01); *H01L 21/76877* (2013.01)

(58) Field of Classification Search
CPC ............ H01L 21/0335; H01L 21/0337; H01L 21/0338; H01L 21/76816; H01L 21/76877
See application file for complete search history.

(56) References Cited

U.S. PATENT DOCUMENTS

2015/0155198 A1* 6/2015 Tsai .................... H01L 21/3085
438/674

\* cited by examiner

*Primary Examiner* — Walter H Swanson
(74) *Attorney, Agent, or Firm* — CKC & Partners Co., LLC

(57) ABSTRACT

A method of forming a patterned hard mask includes: forming first photoresist features on a hard mask layer; forming at least one sacrificial feature between immediately-adjacent two of the first photoresist features on the hard mask layer; performing a trimming process to the first photoresist features to form second photoresist features; and using the at least one sacrificial feature and the second photoresist features as etching mask, and performing a first etching process to the hard mask layer, in which a plurality of trenches are formed in the hard mask layer to obtain the patterned hard mask.

20 Claims, 5 Drawing Sheets

METHOD OF FORMING A PATTERNED HARD MASK AND METHOD OF FORMING CONDUCTIVE LINES

BACKGROUND

Field of Invention

The present invention relates to a method of forming a hard mask and a method of forming conductive lines with the hard mask.

Description of Related Art

As sizes of conductive lines of semiconductor devices are designed below sub-micron ranges, it is become difficult to miniaturize metal lines (ML) during fabrication processing. Moreover, the technique to form metal lines has also reached the limitation, and thus there is a need to develop a method decreasing widths of metal lines.

Therefore, the people skilled in this field have been dedicated to developing a method to solve the above problems.

SUMMARY

An aspect of the present invention is to provide a method of forming a patterned hard mask. The method includes: forming first photoresist features on a hard mask layer; forming at least one sacrificial feature between immediately-adjacent two of the first photoresist features on the hard mask layer; performing a trimming process to the first photoresist features to form second photoresist features; and using the at least one sacrificial feature and the second photoresist features as etching mask, and performing a first etching process to the hard mask layer, in which a plurality of trenches are formed in the hard mask layer to obtain the patterned hard mask.

In some embodiments of the present disclosure, the at least one sacrificial feature and the immediately-adjacent two of the second photoresist features are spaced apart by the same intervals.

In some embodiments of the present disclosure, forming the at least one sacrificial feature located between the immediately-adjacent two of the first photoresist features includes: forming a sacrificial layer over the first photoresist features; and partially removing the sacrificial layer to form the sacrificial feature which is in contact with adjacent one of the immediately-adjacent first photoresist features.

In some embodiments of the present disclosure, selectively removing the sacrificial layer includes: performing a selective etching process to the sacrificial layer with an end point detection to expose a top surface of each first photoresist feature; and performing a litho-etch process to the sacrificial layer to form the sacrificial feature.

In some embodiments of the present disclosure, forming the at least one sacrificial feature between the immediately-adjacent two of the first photoresist features includes: forming two sacrificial features between immediately-adjacent two of the first photoresist features.

In some embodiments of the present disclosure, the two sacrificial features and the immediately-adjacent two of the second photoresist features are spaced apart by the same intervals.

In some embodiments of the present disclosure, each interval is equal to or smaller than 12.5 nm.

In some embodiments of the present disclosure, the trenches are repeatedly arranged along with the same intervals.

In some embodiments of the present disclosure, each trench has a width equal to or smaller than 12.5 nm.

In some embodiments of the present disclosure, the first photoresist features include hydrocarbon, the trimming process is an oxygen-based plasma process.

Another aspect of the present disclosure is related to a method of forming conductive lines. The method includes: forming first photoresist features on a hard mask layer; forming at least one sacrificial feature between immediately-adjacent two of the first photoresist features; performing a trimming process to the first photoresist features to form second photoresist features, and thus the sacrificial feature is located between immediately-adjacent two of the second photoresist features; using the at least one sacrificial feature and the second photoresist features as etching mask, performing a first etching process to the hard mask layer, in which a plurality of opening trenches are formed in the hard mask layer; performing a second etching process to a dielectric layer under the hard mask layer, such that a plurality of recesses corresponding to the trenches are formed in the dielectric layer; and forming the conductive lines in the recesses.

In some embodiments of the present disclosure, the at least one sacrificial feature and the immediately-adjacent two of the second photoresist features are alternately spaced apart by the same intervals.

In some embodiments of the present disclosure, forming the at least one sacrificial feature located between the immediately-adjacent two of the first photoresist features includes: forming a sacrificial layer over the first photoresist features; and partially removing the sacrificial layer to form the sacrificial feature which is in contact with immediately-adjacent one of the first photoresist features.

In some embodiments of the present disclosure, selectively removing the sacrificial layer includes: performing a selective etching process to the sacrificial layer with an end point detection, such that a top surface of each first photoresist feature is exposed; and performing a litho-etch process to the sacrificial layer to form the sacrificial feature.

In some embodiments of the present disclosure, forming the at least one sacrificial feature between the immediately-adjacent two of the first photoresist features includes: forming two sacrificial features between the immediately-adjacent two of the first photoresist features.

In some embodiments of the present disclosure, the two sacrificial features and the immediately-adjacent two of the second photoresist features are spaced apart by the same intervals.

In some embodiments of the present disclosure, the each interval has a width equal to or smaller than 12.5 nm.

In some embodiments of the present disclosure, the immediately-adjacent two of the conductive lines are spaced apart by the same intervals.

In some embodiments of the present disclosure, each conductive line has a width smaller than or equal to 12.5 nm.

In some embodiments of the present disclosure, the first photoresist features include hydrocarbon, and the trimming process is an oxygen-based plasma process.

In summary, the present disclosure provides a method using trimming process to miniaturize photoresist features on a hard mask, such that small trenches can be formed in the hard mask. Moreover, an etching process can be performed to a dielectric by using the hard mask to from small recesses, and sophisticated metal lines, such as metal lines have widths smaller than 12.5 nm, can be formed in the recesses. Therefore, small metal lines can be formed with only one hard mask.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 2-10 illustrate cross-sectional views of intermediate stages of a method for fabricating conductive lines.

DETAILED DESCRIPTION

Figure 1A:
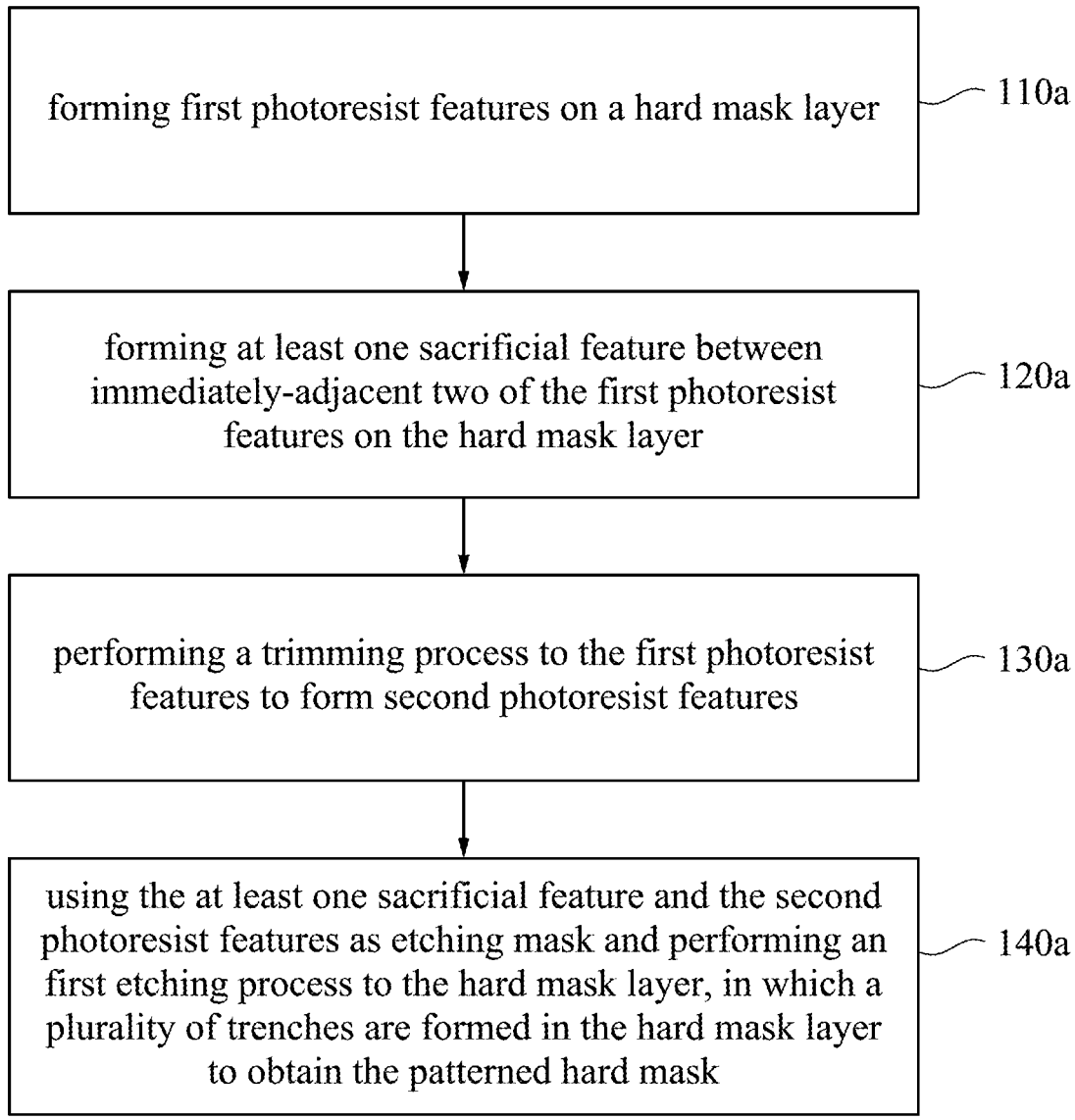
FIG. 1A is a flowchart of a method for fabricating a patterned hard mask in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Reference is made to FIG. 1. FIG. 1 is a flowchart of a method 100a for fabricating a patterned hard mask in accordance with some embodiments of the present disclosure. The method 100a starts from Step 110a, in which first photoresist features are formed on a hard mask layer. Next, the method 100a continues with Step 120a, in which at least one sacrificial feature is formed between immediately-adjacent two of the first photoresist features on the hard mask layer. The method 100a continues with the Step 130a, in which a trimming process is performed to the first photoresist features to form second photoresist features. Thereafter, the method 100a continues with 140a, in which the at least one sacrificial feature and the second photoresist features are used as etching mask to perform a first etching process to the hard mask layer, and a plurality of trenches are formed in the hard mask layer to obtain the patterned hard mask.

FIGS. 2-8 illustrate cross-sectional views of intermediate stages of a method 100a for fabricating a patterned hard mask. FIG. 1 illustrates the detail about Step 110a of FIG. 1A. Referring to FIG. 1 and Step 110a, first photoresist features 211 are formed on a hard mask layer 230, in which the hard mask layer 230 is formed on a dielectric layer 250. In some embodiments of the present disclosure, the dielectric layer 250 is formed on a semiconductor substrate, which can be a semiconductor crystalline substrate, such as a silicon substrate. In some embodiments of the present disclosure, the first photoresist features 211 are parallel lines features, in which intervals x1 having the same widths respectively located between immediately-adjacent two of the first photoresist features 211.

Specifically, a photoresist layer (not shown) is applied on a top surface of the hard mask layer 230. Thereafter, the photoresist layer is exposed to light using a photomask (not shown), and exposed or unexposed portions of the photoresist layer are removed depending on whether a positive or negative resist is used in the photoresist layer with a resist developer, such that the photoresist features 211 are formed. The dielectric layer 250 can include a dielectric material such as silicon oxide. The present disclosure is not limited in this respect.

Figure 3:
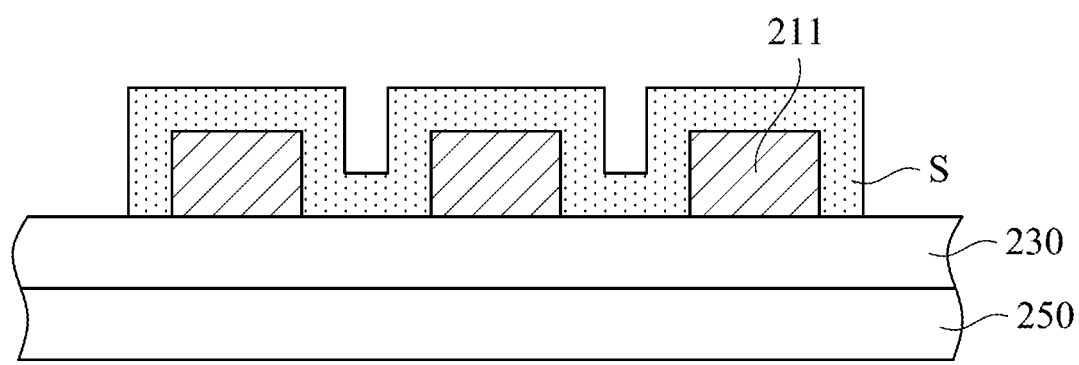
Figure 4:
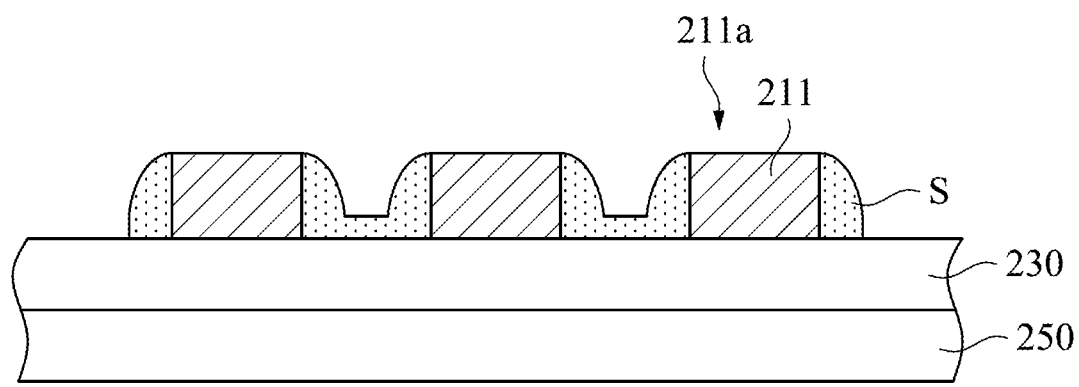
Figure 5:
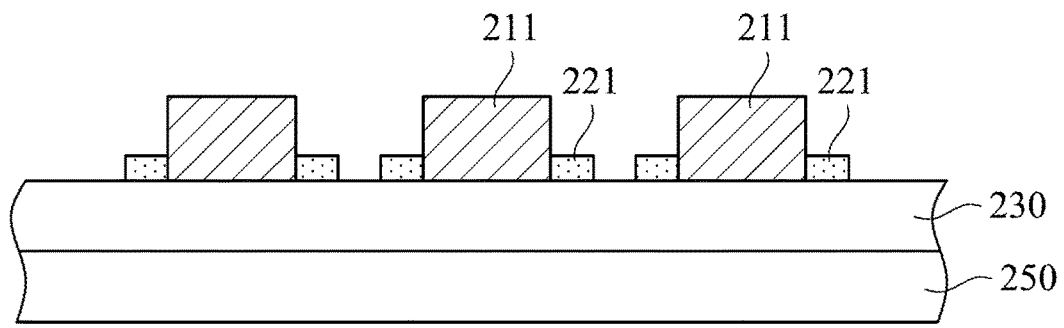

FIGS. 3-5 illustrate the detail about Step 120a of FIG. 1A, in which at least one sacrificial feature 221 is formed between immediately-adjacent two of the first photoresist features 211 on the hard mask layer 230. Referring to FIG. 3, a sacrificial layer S is conformally formed over the first photoresist features 211 by a conformal deposition process such as, for example, Chemical Vapor Deposition (CVD), atomic layer deposition (ALD) or other suitable deposition processes. The sacrificial layer S includes silicon oxide or silicon nitride, but the present disclosure is not limited in this respect.

Referring to FIGS. 4-5, the sacrificial layer S is partially removed to form the sacrificial feature 221, and the sacrificial feature 221 is in contact with one of the immediately-adjacent first photoresist features 211. Specifically, a selective etching process is performed to the sacrificial layer S with an end point detection to expose a top surface 211a of each first photoresist feature 211, and then a litho-etch process is performed to divide each sacrificial layer S between immediately-adjacent two of the first photoresist features 211 to form two separate sacrificial features 221.

Figure 6:
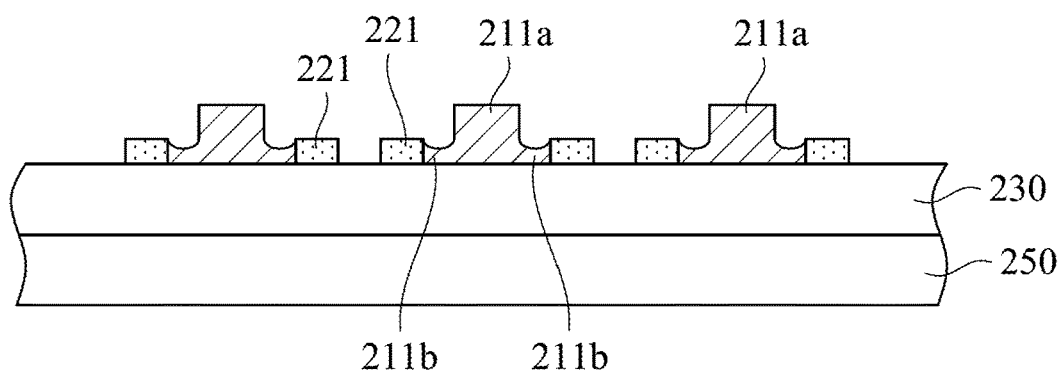
Figure 7:
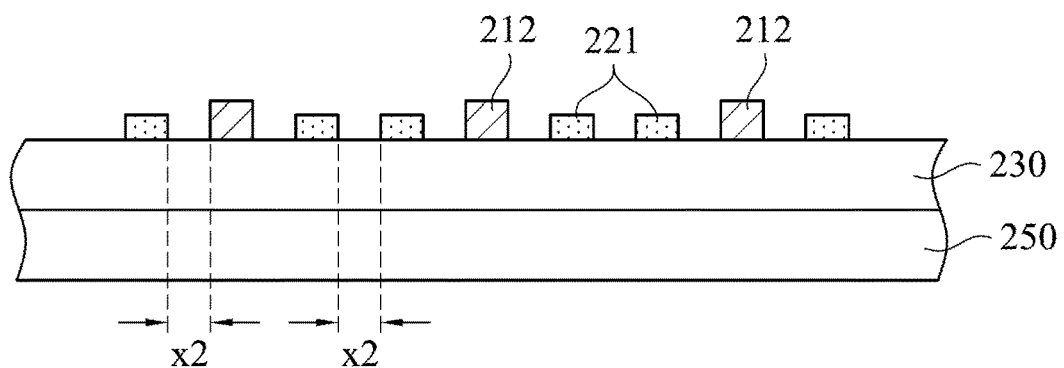

FIGS. 6-7 illustrate the detail about Step 130a of FIG. 1A, in which a trimming process is performed to the first photoresist features 211 to form second photoresist features 212. Specifically, the first photoresist features 211 include a hydrocarbon material such as a hydrocarbon containing a photo resist mask material, the trimming process is an oxygen-based plasma process. The present disclosure is not limited in this respect. According to FIG. 6, the first photoresist features 211a are formed by the trimming process, and the first photoresist features 211a have side portions 211b, in which the side portions 211b have heights lower than a central top of the first photoresist features 211a, and the side portions 211b have concave portions that are lower than a top of the adjacent sacrificial feature 221. According to FIG. 7, a litho-etch process is performed to the first photoresist features 211a after the aforementioned trimming process, and some portions of the first photoresist features 211a are removed to form the second photoresist features 212. For instance, the side portions 211b shown in FIG. 6 are removed. The present disclosure is not limited in this respect.

In some embodiments of the present disclosure, the at least one sacrificial feature 221 and the immediately-adjacent one of the second photoresist features 212 are spaced apart by the intervals x2, and the interval x2 is equal to or smaller than 12.5 nm. The present disclosure is not limited in this respect. In some embodiments of the present disclosure, two sacrificial features 221, which are also separated by the same interval x2, are formed between the immediately-adjacent two of the second photoresist features 212. That is, the immediately-adjacent two of the second photoresist features 212 and sacrificial features 221 are spaced apart by the same intervals x2. The present disclosure is not limited in this respect.

Figure 8:
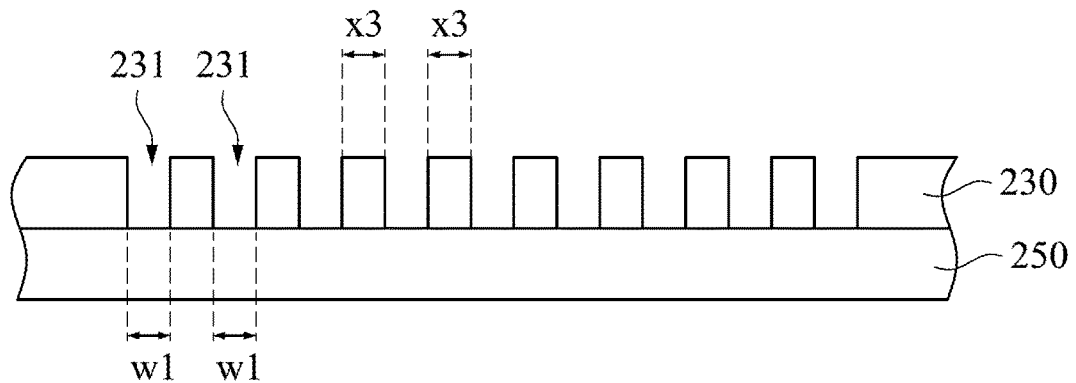

FIG. 8 illustrates the detail about Step 140a of FIG. 1A, in which the second photoresist features 212 and the sacrificial features 221 are used as etching mask to perform a first etching process to the hard mask layer 230. Thereafter, a plurality of trenches 231 are formed in the hard mask layer 230 to pattern the hard mask layer 230, such that a pattern hard mask is obtained. The first etching process can include an anisotropic etching process, such as a reactive-ion etching process or a plasma dry etching process. The present disclosure is not limited in this respect. In some embodiments of the present disclosure, the trenches 231 are repeatedly arranged by the same intervals x3, and each trench 231 has a width w1 equal to or smaller than 12.5 nm. The present disclosure is not limited in this respect.

Figure 1B:
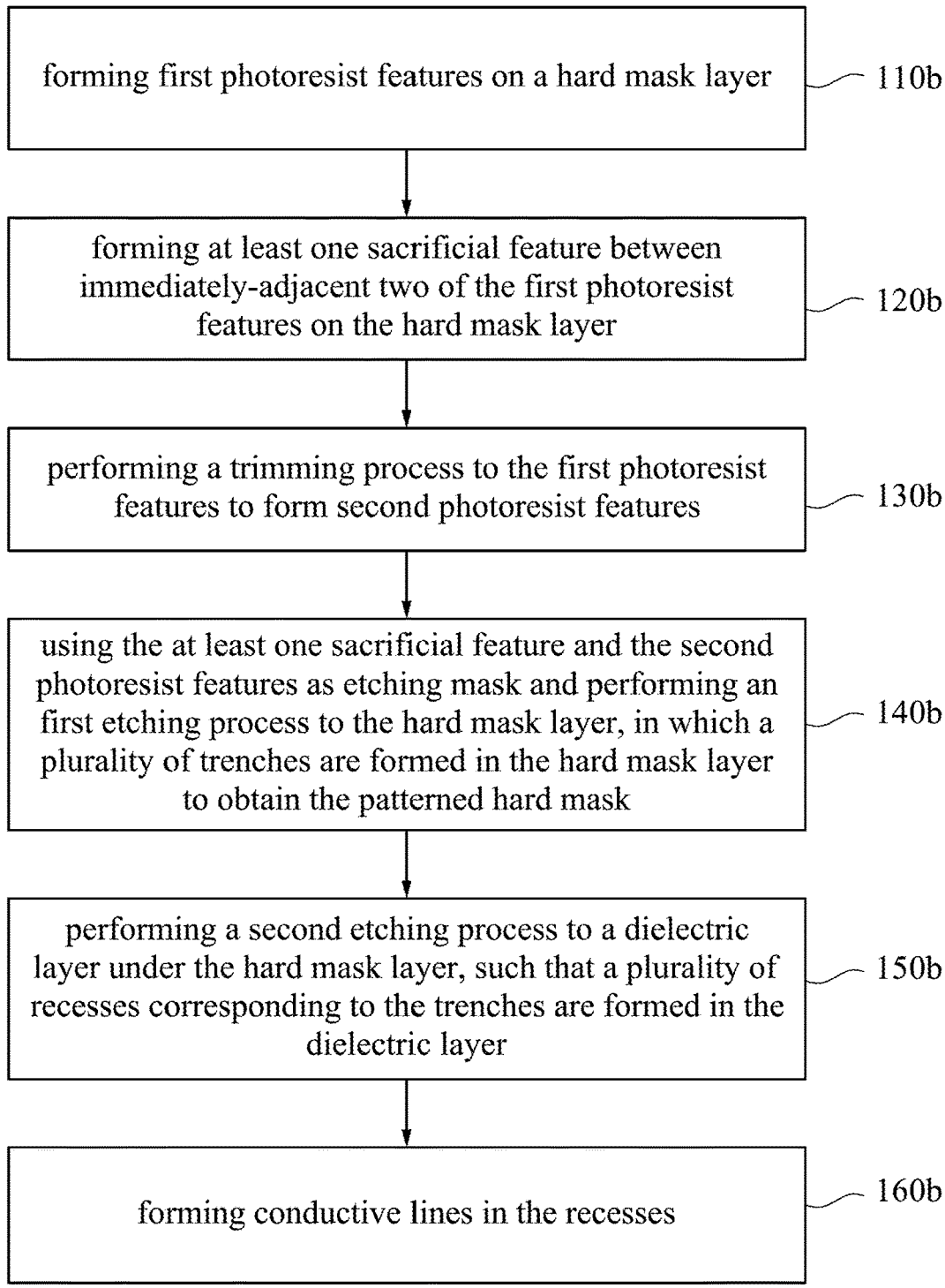
FIG. 1B is a flowchart of a method for fabricating conductive lines in accordance with some embodiments of the present disclosure.
Figure 2:
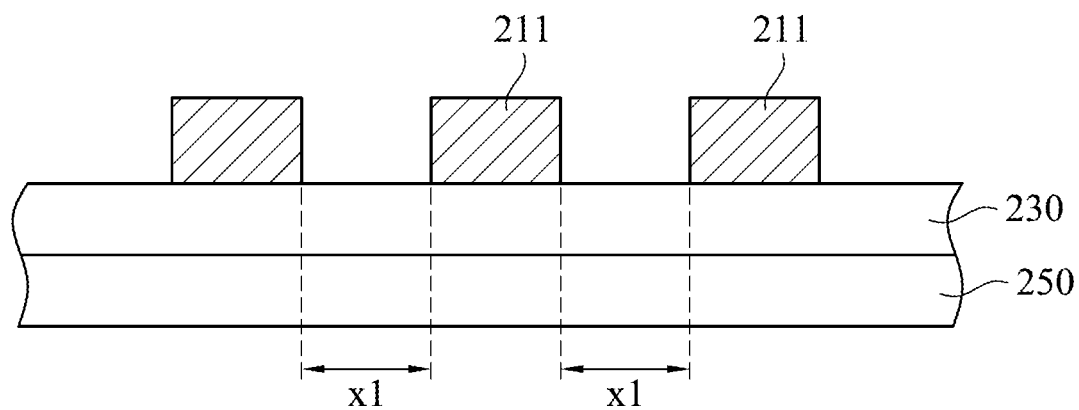
FIGS. 2-8 illustrate cross-sectional views of intermediate stages of a method for fabricating a patterned hard mask.

Reference is made to FIG. 1B. Another aspect of the present disclosure is related to a method 100b of forming conductive lines. In some embodiments of the present disclosure, the method 100b starts from Step 110b, in which first photoresist features are formed on a hard mask layer. Next, the method 100b continues with Step 120b, in which at least one sacrificial feature is formed between immediately-adjacent two of the first photoresist features on the hard mask layer. The method 100b continues with the Step 130b, in which a trimming process is performed to the first photoresist features to form second photoresist features. Thereafter, the method 100b continues with Step 140b, in which the at least one sacrificial feature and the second photoresist features are used as etching mask to perform a first etching process to the hard mask layer, and a plurality of trenches are formed in the hard mask layer. The, method 100b continues with Step 150b, in which a second etching process is performed to the dielectric layer under the hard mask layer, such that a plurality of recesses corresponding to the trenches are formed in the dielectric layer. Thereafter, the method 100b continues with Step 160b, in which the conductive lines are formed in the recesses. Specifically, Step 110a through Step 140a of method 100a can correspond to Steps 110b through Step 140b of method 100b. These steps of the methods 100a, 100b are substantially the same, and the most significant difference therebetween is that the method 100b further has Step 150b and Step 160b.

Figure 9:
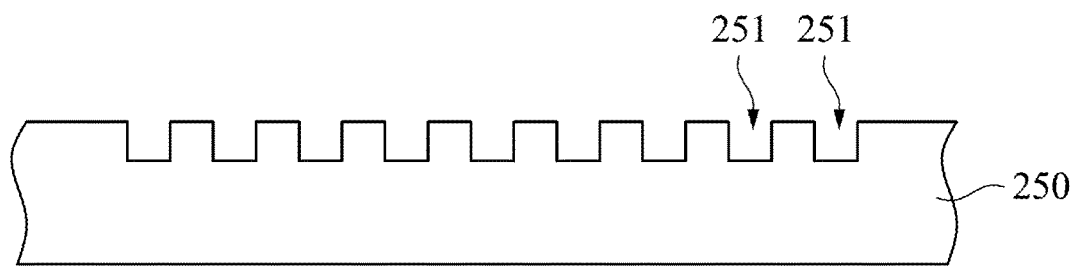

FIG. 9 illustrates the detail about Step 150b of FIG. 1B, in which the second etching process is performed to the dielectric layer 250 under the hard mask layer 230, such that a plurality of recesses 251 corresponding to the trenches 231 are formed in the dielectric layer 250. In this case, the hard mask layer 230 which has a plurality of recesses 251 is used as etching mask in the second etching process, and the second etching process can be an anisotropic etching process, such as a reactive-ion etching process or a plasma dry etching process. The present disclosure is not limited in this respect.

Figure 10:
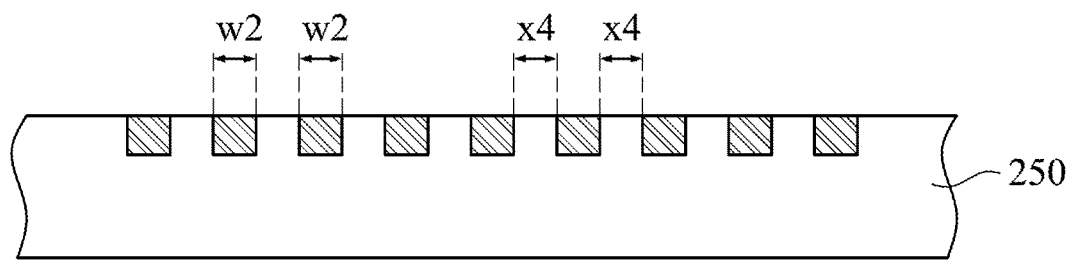

FIG. 10 illustrates the detail about Step 160b of FIG. 1B, in which the conductive lines 270 are respectively formed in the recesses 251 of the dielectric layer 250. Specifically, the conductive lines 270 include a conductive material such as tungsten, aluminum, copper, titanium, tantalum, titanium nitride, tantalum nitride, or the alloys thereof. The conductive lines 270 can be formed by chemical vapor deposition (CVD), physical vapor deposition (PVD), plating (e.g., electro-plating, or electro-less plating), or other suitable method. Moreover, a planarization process, such as a chemical mechanical polish (CMP), can be performed to the dielectric layer 250 and the conductive lines 270, such that a top surface of the dielectric layer 250 and top surfaces of the conductive lines 270 are level. In some embodiments of the present disclosure, immediately-adjacent two of the conductive lines 270 are spaced apart by the same intervals x4. Each conductive line 270 has the same widths w2 smaller than or equal to 12.5 nm. The present disclosure is not limited in this respect.

In summary, the present disclosure provides a method using trimming process to miniaturize photoresist features on a hard mask, such that small trenches can be formed in the hard mask. Moreover, an etching process can be performed to a dielectric by using the hard mask to from small recesses, and sophisticated metal lines, such as metal lines have widths smaller than 12.5 nm, can be formed in the recesses. Therefore, small metal lines can be formed with only one hard mask.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of forming a patterned hard mask comprising:
   forming first photoresist features on a hard mask layer;
   forming at least one sacrificial feature between adjacent two of the first photoresist features on the hard mask layer;
   performing a trimming process to the first photoresist features to form second photoresist features; and
   using the at least one sacrificial feature and the second photoresist features as an etching mask, and performing an etching process to the hard mask layer, wherein a plurality of trenches is formed in the hard mask layer to obtain the patterned hard mask.

2. The method of claim 1, wherein the at least one sacrificial feature and immediately-adjacent two of the second photoresist features are spaced apart by the same intervals.

3. The method of claim 1, wherein forming the at least one sacrificial feature located between the immediately-adjacent two of the first photoresist features comprises:
   forming a sacrificial layer over the first photoresist features; and
   partially removing the sacrificial layer to form the sacrificial feature which is in contact with one of the immediately-adjacent first photoresist features.

4. The method of claim 3, wherein selectively removing the sacrificial layer comprises:
   performing a selective etching process to the sacrificial layer with an end point detection to expose a top surface of each of the first photoresist features; and
   performing a litho-etch process to the sacrificial layer to form the sacrificial feature.

5. The method of claim 1, wherein forming the at least one sacrificial feature between the immediately-adjacent two of the first photoresist features comprises:

forming two sacrificial features between the immediately-adjacent two of the first photoresist features.

6. The method of claim 5, wherein the two sacrificial features and immediately-adjacent two of the second photoresist features are spaced apart by the same intervals.

7. The method of claim 6, wherein each of the intervals is equal to or smaller than 12.5 nm.

8. The method of claim 1, wherein the trenches are repeatedly arranged by the same intervals.

9. The method of claim 8, wherein each of the trenches has a width equal to or smaller than 12.5 nm.

10. The method of claim 1, wherein the first photoresist features comprise hydrocarbon, the trimming process is an oxygen-based plasma process.

11. A method of forming conductive lines comprising:
forming first photoresist features on a hard mask layer;
forming at least one sacrificial feature between immediately-adjacent two of the first photoresist features;
performing a trimming process to the first photoresist features to form second photoresist features, and thus the sacrificial feature is located between immediately-adjacent two of the second photoresist features;
using the at least one sacrificial feature and the second photoresist features as an etching mask, performing an etching process to the hard mask layer, wherein a plurality of trenches is formed in the hard mask layer;
performing a second etching process to a dielectric layer under the hard mask layer, such that a plurality of recesses corresponding to the trenches is formed in the dielectric layer; and
forming the conductive lines in the recesses.

12. The method of claim 11, wherein the at least one sacrificial feature and the immediately-adjacent two of the second photoresist features are alternately spaced apart by the same intervals.

13. The method of claim 11, wherein forming the at least one sacrificial feature located between the immediately-adjacent two of the first photoresist features comprises:
forming a sacrificial layer over the first photoresist features; and
partially removing the sacrificial layer to form the sacrificial feature which is in contact with an immediately-adjacent one of the first photoresist features.

14. The method of claim 13, wherein selectively removing the sacrificial layer comprises:
performing a selective etching process to the sacrificial layer with an end point detection, such that a top surface of each of the first photoresist features is exposed; and
performing a litho-etch process to the sacrificial layer to form the sacrificial feature.

15. The method of claim 11, wherein forming the at least one sacrificial feature between the immediately-adjacent two of the first photoresist features comprises:
forming two sacrificial features between the immediately-adjacent two of the first photoresist features.

16. The method of claim 15, wherein the two sacrificial features and the immediately-adjacent two of the second photoresist features are spaced apart by the same intervals.

17. The method of claim 16, wherein each of the intervals has a width equal to or smaller than 12.5 nm.

18. The method of claim 11, wherein immediately-adjacent two of the conductive lines are spaced apart by the same intervals.

19. The method of claim 11, wherein each conductive line has a width smaller than or equal to 12.5 nm.

20. The method of claim 11, wherein the first photoresist features comprise hydrocarbon, the trimming process is an oxygen-based plasma process.

* * * * *